(12) United States Patent
Saido et al.

(10) Patent No.: US 10,961,625 B2
(45) Date of Patent: Mar. 30, 2021

(54) SUBSTRATE PROCESSING APPARATUS, REACTION TUBE AND METHOD OF MANUFACTURING SEMICONDUCTOR DEVICE

(71) Applicant: Kokusai Electric Corporation, Tokyo (JP)

(72) Inventors: Shuhei Saido, Toyama (JP); Takafumi Sasaki, Toyama (JP); Hidenari Yoshida, Toyama (JP); Yusaku Okajima, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 5 days.

(21) Appl. No.: 16/507,930

(22) Filed: Jul. 10, 2019

(65) Prior Publication Data

US 2019/0330738 A1 Oct. 31, 2019

Related U.S. Application Data

(63) Continuation of application No. PCT/JP2017/032706, filed on Sep. 11, 2017.

(30) Foreign Application Priority Data

Feb. 15, 2017 (JP) .............................. JP2017-026179

(51) Int. Cl.
*C23C 16/455* (2006.01)
*C23C 16/44* (2006.01)
*H01L 21/02* (2006.01)

(52) U.S. Cl.
CPC .... *C23C 16/45563* (2013.01); *C23C 16/4412* (2013.01); *H01L 21/0217* (2013.01)

(58) Field of Classification Search
CPC .......... C23C 16/45563; C23C 16/4412; C23C 16/45578; C23C 16/45574; C23C 16/345; H01L 21/0217
See application file for complete search history.

(56) References Cited

U.S. PATENT DOCUMENTS

| | | |
|---|---|---|
| 2015/0270125 A1 | 9/2015 | Sasaki et al. |
| 2017/0294318 A1 | 10/2017 | Yoshida et al. |
| 2018/0187307 A1* | 7/2018 | Yoshida ............ C23C 16/45546 |

FOREIGN PATENT DOCUMENTS

| | | | |
|---|---|---|---|
| JP | 2006-080101 A | 3/2006 | |
| JP | 2010-147432 A | 7/2010 | |

(Continued)

*Primary Examiner* — Armando Rodriguez
(74) *Attorney, Agent, or Firm* — Edell, Shapiro & Finnan, LLC

(57) ABSTRACT

According to one aspect of the technique of the present disclosure, there is provided a substrate processing apparatus including: a reaction tube; a substrate retainer; a cylindrical portion provided inside the reaction tube and concentric with the reaction tube and comprising a process chamber; a gas supply part in an annular gap between the reaction tube and the cylindrical portion; a gas supply port through which the gas supply part communicates with the process chamber; a first gas exhaust port provided at the cylindrical portion, through which the gap communicates with the process chamber; an outlet connected to the reaction tube at a location lower than the first gas exhaust port and opposite to the gas supply port; and a second gas exhaust port provided at the cylindrical portion at a location lower than the first gas exhaust port and aligned with a same orientation as the outlet.

20 Claims, 8 Drawing Sheets

(56) References Cited

FOREIGN PATENT DOCUMENTS

| JP | 2015-183224 A | 10/2015 |
|----|---------------|---------|
| WO | 2004027846 A1 | 4/2004 |
| WO | 2015041376 A1 | 3/2015 |

* cited by examiner

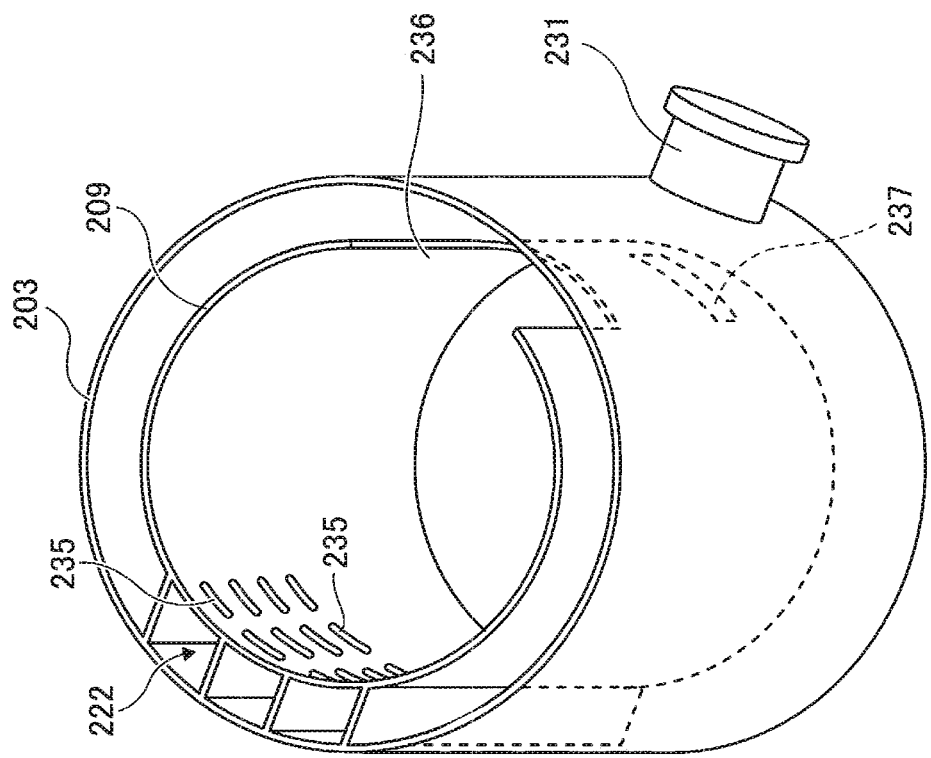
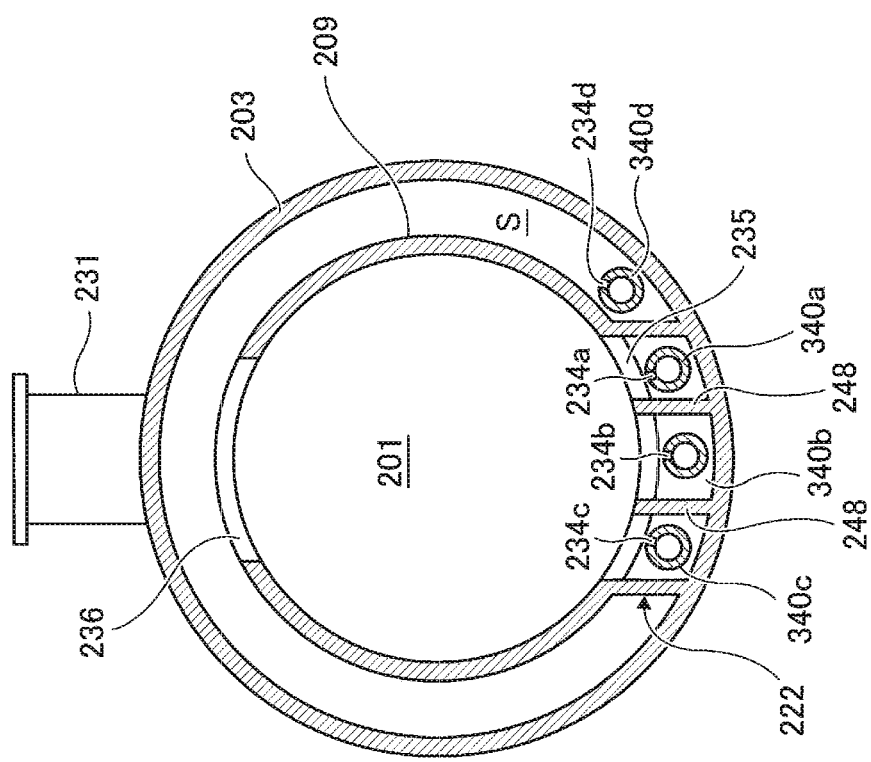

US 10,961,625 B2

SUBSTRATE PROCESSING APPARATUS, REACTION TUBE AND METHOD OF MANUFACTURING SEMICONDUCTOR DEVICE

CROSS REFERENCE TO RELATED APPLICATIONS

This application is a continuation of International Application No. PCT//JP2017/032706, filed on Sep. 11, 2017, which claims priority under 35 U.S.C. § 119 to Application No. JP 2017-026179 filed on Feb. 15, 2017, the entire contents of which are hereby incorporated by reference.

TECHNICAL FIELD

The present disclosure relates to a substrate processing apparatus, a reaction tube and a method of manufacturing a semiconductor device.

BACKGROUND

As an example of a substrate processing apparatus or a semiconductor manufacturing apparatus, a vertical type apparatus may be used. The vertical type apparatus includes a boat serving as a substrate retainer capable of accommodating (supporting) a plurality of substrates (hereinafter, also referred to as "a plurality of wafers") in multiple stages. According to related arts, the plurality of the substrates is batch-processed in a process chamber provided in a reaction tube of the vertical type apparatus while the plurality of the substrates is supported by the boat.

However, in the vertical type apparatus, a velocity distribution of a process gas may not be uniform among the plurality of the wafers since a pressure loss on an exhaust side (downstream side of the plurality of the wafers) in the reaction tube may be large. As a result, decomposition of the process gas may be accelerated to different degrees among the plurality of the wafers. Therefore, due to a difference in the decomposition degree of the process gas while passing through the plurality of the wafers, a difference in film thickness formed on the plurality of the wafers may occur, for example, between an uppermost wafer and a lowermost wafer of the plurality of the wafers.

SUMMARY

Described herein is a technique capable of uniformizing a velocity distribution of a process gas among the plurality of the wafers.

According to one aspect of the technique of the present disclosure, there is provided a substrate processing apparatus including: a reaction tube with a closed upper end, which constitutes a reaction vessel; a substrate retainer configured to accommodate a plurality of substrates; a cylindrical portion provided inside the reaction tube in a manner concentric with the reaction tube and including a process chamber where the plurality of the substrates is processed, the process chamber being configured to accommodate the substrate retainer; a gas supply part provided in an annular gap between the reaction tube and the cylindrical portion along an extending direction of the gap, and configured to supply a process gas into the process chamber; a gas supply port through which the gas supply part communicates with the process chamber; a first gas exhaust port provided at the cylindrical portion, through which the gap communicates with the process chamber, and configured to exhaust an inner atmosphere of the process chamber to the gap; an outlet connected to the reaction tube at a location lower than the first gas exhaust port and opposite to the gas supply port when viewed from a center of the cylindrical portion, and configured to exhaust an inner atmosphere of the gap; and a second gas exhaust port provided at the cylindrical portion at a location lower than the first gas exhaust port and aligned with a same orientation as the outlet with reference to the center of the cylindrical portion, and configured to exhaust an atmosphere of a lower portion of the process chamber.

BRIEF DESCRIPTION OF THE DRAWINGS

FIG. 2 schematically illustrates a horizontal cross-section of a reaction tube of the substrate processing apparatus according to the embodiments described herein.

FIG. 3 is a perspective view schematically illustrating a cross-section of the reaction tube of the substrate processing apparatus according to the embodiments.

DETAILED DESCRIPTION

Embodiments

Hereinafter, one or more embodiments (hereinafter, simply referred to as "embodiments") according to the technique of the present disclosure will be described with reference to FIG. 1. A substrate processing apparatus according to the embodiments of the technique is configured as an example of a semiconductor manufacturing apparatus used for manufacturing a semiconductor device.

Figure 1:
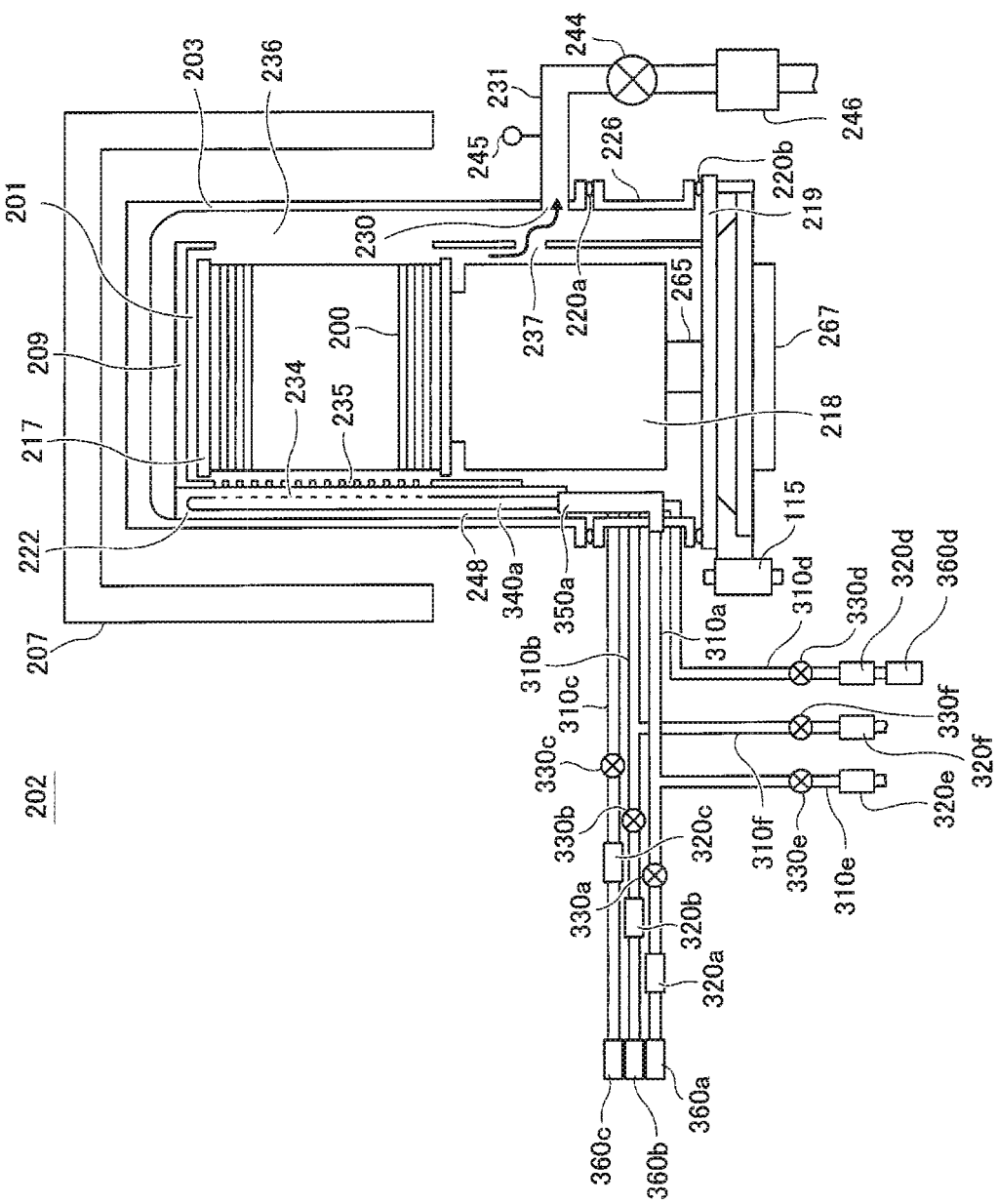
FIG. 1 schematically illustrates a vertical cross-section of a vertical type process furnace of a substrate processing apparatus according to one or more embodiments described herein.

As shown in FIG. 1, a process furnace 202 of the substrate processing apparatus according to the embodiments includes a heater 207 serving as a heating device (heating mechanism). The heater 207 is cylindrical, and is vertically installed while being supported by a heater base (not shown) serving as a support plate. The heater 207 also functions as an activation mechanism (excitation mechanism) for activating (exciting) a process gas by heat.

A reaction tube 203 is provided in an inner side of the heater 207 to be aligned in a manner concentric with the heater 207. A reaction vessel (also referred to as a "process vessel") is constituted by the reaction tube 203. For example, the reaction tube 203 is made of a material such as quartz ($SiO_2$) and silicon carbide (SiC) such that the reaction tube 203 is resistant to heat and pressure. The reaction tube 203 is of a cylindrical shape with an open lower end and a closed upper end. The upper end of the reaction tube 203 is closed by a flat wall body. That is, the reaction tube 203 has a ceiling. Installed in the reaction tube 203 are: a cylindrical portion 209 having a cylindrical shape; a nozzle arrangement chamber 222 partitioned between the cylindrical portion 209 and the reaction tube 203; a plurality of gas supply slits 235 serving as a gas supply port provided at the cylindrical portion 209; a first gas exhaust port 236 provided at the cylindrical portion 209; and a second gas exhaust port 237 provided at the cylindrical portion 209 below the first gas exhaust port 236. The cylindrical portion 209 is of a cylindrical shape with an open lower end and a closed upper end. The upper end of the cylindrical portion 209 is closed by a flat wall body. That is, the cylindrical portion 209 has a ceiling. The cylindrical portion 209 is immediately adjacent to a plurality of wafers including a wafer 200 so as to surround the circumference of the plurality of the wafers. A process chamber 201 is provided in the cylindrical portion 209 of the reaction tube 203. The plurality of the wafers including the wafer 200 serving as a substrate is processed in the process chamber 210. The process chamber 201 is configured to accommodate a boat 217 serving as a substrate retainer capable of accommodating (supporting or holding) the plurality of the wafers including the wafer 200 vertically arranged in a horizontal orientation in a multistage manner.

The lower end of the reaction tube 203 is supported by a cylindrical manifold 226. For example, the manifold 226 is made of a metal such as nickel alloy and stainless steel, or is made of a heat resistant material such as quartz and SiC. A flange (not shown) is provided at an upper end of the manifold 226, and the lower end of the reaction tube 203 is provided on the flange and supported by the flange. A sealing part 220a such as an O-ring is provided between the flange and the upper end of the reaction tube 203 to airtightly seal the inside of the reaction tube 203.

A seal cap 219 is airtightly attached to a lower end opening of the manifold 226 via a sealing part 220b such as an O-ring. The seal cap 219 is configured to airtightly seal a lower end opening of the reaction tube 203, that is, the lower end opening of the manifold 226. For example, the seal cap 219 is made of a metal such as nickel alloy and stainless steel, and is disc-shaped. The seal cap 219 may be configured such that an outer side of the seal cap 219 is covered with a heat resistant material such as quartz ($SiO_2$) and silicon carbide (SiC).

A boat support 218 configured to support the boat 217 is provided on the seal cap 219. The boat support 218 is made of a heat resistant material such as quartz and SiC. The boat support 218 functions not only as a support for supporting the boat 218 but also as a heat insulating part. The boat 217 is provided vertically on the boat support 218. For example, the boat 217 is made of a heat resistant material such as quartz and SiC. The boat 217 includes a bottom plate that can be placed on the boat support 218 and a top plate provided above the bottom plate. A plurality of support columns (for example, three or four support columns) is provided between the bottom plate and the top plate. The plurality of the support columns is installed to connect the bottom plate and the top plate. The boat 217 accommodates (supports) the plurality of the wafers including the wafer 200. The plurality of the wafers is horizontally oriented with predetermined intervals therebetween. That is, the plurality of the wafers is supported by the plurality of the support columns of the boat 271 with their centers aligned with each other. The stacking direction of the plurality of the wafers is equal to an axial direction of the reaction tube 203.

A boat rotating mechanism 267 configured to rotate the boat 217 is provided at the seal cap 219 opposite to the process chamber 201. A rotating shaft 265 of the boat rotating mechanism 267 is connected to the boat support 218 through the seal cap 219. As the boat rotating mechanism 267 rotates the boat 217 via the boat support 218, the plurality of the wafers including the wafer 200 supported by the boat 217 is rotated.

The seal cap 219 may be moved upward or downward in the vertical direction by a boat elevator 115 provided outside the reaction tube 203. The boat elevator 115 serves as an elevating mechanism. As the seal cap 219 is moved upward or downward by the boat elevator 115, the boat 217 is transferred (loaded) into the process chamber 201 or transferred (unloaded) out of the process chamber 201.

Nozzle supports 350a, 350b and 350c, which are configured to support nozzles 340a, 340b and 340c, are provide at the manifold 226 so as to pass through the manifold 226. Each of the nozzles 340a, 340b and 340c serves as a gas nozzle. The nozzles 340a through 340d are configured to supply the process gas into the process chamber 201. According to the embodiments, for example, four nozzle supports including the nozzle supports 350a through 350c are installed. For example, the nozzle supports 350a through 350c are made of a material such as nickel alloy and stainless steel. Gas supply pipes 310a, 310b and 310c configured to supply gases such as the process gas into the process chamber 201 are connected to first ends of the nozzle supports 350a through 350c, respectively. A gas supply pipe 310d is connected to the nozzle 340d through a nozzle support. The gas supply pipe 310d is configured to supply a gas such as the process gas into a gap S provided between the reaction tube 203 and the cylindrical portion 209. The nozzles 340a through 340d are connected to second ends of the nozzle supports 350a through 350c, respectively. For example, the nozzles 340a through 340d are made of a heat resistant material such as quartz and SiC.

A first process gas supply source 360a configured to supply a first process gas serving as the process gas, a mass flow controller (MFC) 320a serving as a flow rate controller (flow rate control mechanism) and a valve 330a serving as an opening/closing valve are sequentially provided at the gas supply pipe 310a from an upstream side toward a downstream side of the gas supply pipe 310a. A second process gas supply source 360b configured to supply a second process gas serving as the process gas, a mass flow controller (MFC) 320b and a valve 330b are sequentially provided at the gas supply pipe 310b from an upstream side toward a downstream side of the gas supply pipe 310b. A third process gas supply source 360c configured to supply a third process gas serving as the process gas, a mass flow controller (MFC) 320c and a valve 330c are sequentially provided at the gas supply pipe 310c from an upstream side toward a downstream side of the gas supply pipe 310c. An inert gas supply source 360d configured to supply an inert gas serving as the process gas, a mass flow controller (MFC) 320d and a valve 330d are sequentially provided at the gas supply pipe 310d from an upstream side toward a downstream side of the gas supply pipe 310d. Gas supply pipes 310e and 310f configured to supply the inert gas are connected to the gas supply pipes 310a and 310b at downstream sides of the valves 330a and 330b, respectively. .Mass flow controllers (MFCs) 320e and 320f and valves 330e and 330f are sequentially provided at the gas supply pipes 310e and 310f from upstream sides toward downstream sides of the gas supply pipes 310e and 310f, respectively.

A first process gas supply system is constituted mainly by the gas supply pipe 310a, the MFC 320a and the valve 330a. The first process gas supply system may further include the first process gas supply source 360a, the nozzle support 350a and the nozzle 340a. A second process gas supply system is constituted mainly by the gas supply pipe 310b, the MFC 320b and the valve 330b. The second process gas supply system may further include the second process gas supply source 360b, the nozzle support 350b and the nozzle 340b. A third process gas supply system is constituted mainly by the gas supply pipe 310c, the MFC 320c and the valve 330c. The third process gas supply system may further include the third process gas supply source 360c, the nozzle support 350c and the nozzle 340c. An inert gas supply system is constituted mainly by the gas supply pipe 310d, the MFC 320d and the valve 330d. The inert gas supply system may further include the inert gas supply source 360d and the nozzle 340d. In the present specification, the term "process gas" may indicate only the first process gas, indicate only the second process gas, indicate only the third process gas, indicate only the inert gas, or indicate all of the first process gas, the second process gas, the third process gas and the inert gas. In addition, in the present specification, the term "process gas supply system" may indicate only the first process gas supply system, indicate only the second process gas supply system, indicate only the third process gas supply system, indicate only the inert gas supply system, or indicate all of the first process gas supply system, the second process gas supply system, the third process gas supply system and the inert gas supply system.

An exhaust port 230 is provided at the reaction tube 203. The exhaust port 230 opens to the gap S below the second gas exhaust port 237 described later. An exhaust pipe 231 is connected to the exhaust port 230. The exhaust port 230 and the exhaust pipe 231 configure an outlet of the reaction tube 203. A vacuum pump 246 serving as a gas evacuation apparatus is connected to the exhaust pipe 231 through a pressure sensor 245 and an APC (Automatic Pressure Controller) valve 244. The pressure sensor 245 serves as a pressure detector (pressure detection mechanism) to detect an inner pressure of the process chamber 201, and the APC valve 244 serves as an pressure controller (pressure adjusting mechanism). The vacuum pump 246 is configured to vacuum-exhaust an inner atmosphere of the process chamber 201 such that the inner pressure of the process chamber 201 reaches a predetermined pressure (vacuum degree). The exhaust pipe 231 provided at a downstream side of the vacuum pump 246 is connected to a component such as a waste gas processing apparatus (not shown). The APC valve 244 serves as an opening/closing valve. With the vacuum pump 246 in operation, the APC valve 244 may be opened or closed to vacuum-exhaust the process chamber 201 or to stop the vacuum exhaust. With the vacuum pump 246 in operation, by adjusting an opening degree of the APC valve 244, the APC valve 244 is configured to adjust the inner pressure of the process chamber 201 by adjusting the conductance. An exhaust system serving as an exhaust mechanism (outlet) is constituted mainly by the exhaust pipe 231, the APC valve 244 and the pressure sensor 245. The exhaust system may further include the vacuum pump 246. The exhaust system may still further include the exhaust port 230.

A temperature sensor (not shown) serving as a temperature detector is provided in the reaction tube 203. The electrical power supplied to the heater 207 is adjusted based on temperature information detected by the temperature sensor, such that an inner temperature of the process chamber 201 has a desired temperature distribution.

According to the configuration of the process furnace 202 described above, the boat 217 supported by the boat support 218 is transferred (loaded) into the process chamber 201 while the plurality of the wafers including the wafer 200 to be batch-processed is accommodated in the boat 217 in multiple stages. Then, the plurality of the wafers transferred into the process chamber 201 is heated by the heater 207 to a predetermined temperature.

Hereinafter, the configuration of the reaction tube 203 preferably used in the embodiments will be described in detail with reference to FIGS. 2 through 5. In FIG. 3, components such as the nozzle 340 and the boat 217 are omitted for simplification.

As shown in FIGS. 2 and 3, the plurality of the gas supply slits 235 configured to supply the process gas is provided at the cylindrical portion 209. The nozzle arrangement chamber 222 and the process chamber 201 communicate with each other through the plurality of the gas supply slits 235. The nozzle arrangement chamber (also referred to as a "supply buffer" or a "buffer chamber") 222 is partitioned within a space between an outer surface of the cylindrical portion 209 and an inner surface of the reaction tube 203. A portion of a wall of the nozzle arrangement chamber 222 (that is, an outer circumferential wall of the nozzle arrangement chamber 222) is shared with a portion of a wall of the reaction tube 203, and has the same diameter and center as those of the reaction tube 203. With the configuration of the nozzle arrangement chamber 222 described above, it is possible to suppress the gas such as the process gas from bypassing the plurality of the wafers including the wafer 200 and to increase a ratio of an amount of the gas supplied onto the surfaces of the plurality of the wafers to an amount of the gas supplied through the nozzle arrangement chamber 222. In addition, a lower end of the nozzle arrangement chamber 222 may be open and an upper end of the nozzle arrangement chamber 222 may be closed (or partially closed) by a flat plate (not shown). That is, the nozzle arrangement chamber 222 may have a ceiling. When the nozzle arrangement chamber 222 has the ceiling, the ceiling of the nozzle arrangement chamber 222 is provided at substantially the same height as the ceiling of the cylindrical portion 209. That is, the flat plate is provided at substantially the same height as an upper end of the ceiling of the cylindrical portion 209.

The cylindrical portion 209 is disposed coaxially with the reaction tube 203. The gap S is provided between the cylindrical portion 209 and the reaction tube 203. It is possible to form the cylindrical portion 209 and the reaction tube 203 as an integrated body by welding through the wall of the nozzle arrangement chamber 222 or at least one inner wall 248 described later. Alternatively, it is also possible to combine the reaction tube 203 formed as a separate body and the cylindrical portion 209 to which components such as the at least one inner wall 248 is welded.

As shown in FIGS. 2 and 3, the at least one inner wall is provided inside the nozzle arrangement chamber 222 so as to divide (partition) an inner space of the nozzle arrangement chamber 222 into a plurality of spaces. The at least one inner wall 248 is made of the same material as the reaction tube 203, for example, a heat resistant material such as quartz or SiC.

The at least one inner wall (for example, two inner walls) 248 is provided so as to divide (partition) the inner space of the nozzle arrangement chamber 222 from a lower end to an upper end thereof into the plurality of the spaces (for example, three spaces). As a result, for example, the three spaces separated by the two inner walls 248 are provided. Each space of the nozzle arrangement chamber 222 extends along the axial direction of the reaction tube 203, and the nozzles 340a through 340c are respectively provided therein. Since the nozzles 340a through 340c are disposed in the plurality of the spaces (for example, three spaces) separated by the at least one inner wall (for example, two inner walls) 248, it is possible to suppress the process gas supplied through the nozzles 340a through 340c from mixing with one another in the nozzle arrangement chamber 222. With the configuration of the nozzle arrangement chamber 222 described above, it is possible to suppress the formation of a film or the generation of a by-product in the nozzle arrangement chamber 222 due to the mixing of the process gas in the nozzle arrangement chamber 222.

In the gap S provided between the cylindrical portion 209 and the reaction tube 203, the nozzle 340d is aligned along the longitudinal direction of the gap S (an extending direction of the gap S), that is, along the vertical direction. The gap S is of an annular shape so as to surround the cylindrical portion 209 when viewed from a cross-section thereof. A width of the gap S is greater than a width W of a gap (shown in FIG. 5) between the cylindrical portion 209 and the plurality of the wafers including the wafer 200. For example, the width of the gap S is set to be greater than twice the width W.

The nozzles 340a through 340c extend in the longitudinal direction of the gap S (which is an extending direction of the nozzle arrangement chamber 222, that is, the vertical direction) from a lower portion to an upper portion of the nozzle arrangement chamber 222. The nozzle 340d extends in the longitudinal direction of the gap S (the extending direction of the gap S, that is, the vertical direction) from a lower portion to an upper portion of the gap S. For example, each of the nozzles 340a through 340d is configured as an I-shaped long nozzle. A plurality of gas supply holes 234a, a plurality of gas supply holes 234b, a plurality of gas supply holes 234c and a plurality of gas supply holes 234d configured to supply the gas such as the process gas are provided on side surfaces of the nozzles 340a through 340d, respectively. The plurality of the gas supply holes 234a, the plurality of the gas supply holes 234b and the plurality of the gas supply holes 234c are open toward a center of the reaction tube 203, and the plurality of the gas supply holes 234d are open toward a circumferential direction of the reaction tube 203. As described above, for example, three nozzles 340a through 340c are provided in the nozzle arrangement chamber 222 and are configured to supply various types of gases into the process chamber 201. As described above, the nozzle 340d is provided in the gap S. The nozzle 340d is configured to supply the inert gas (purge gas) into the gap S. According to the configurations described above, it is possible to efficiently purge a back side of the cylindrical portion 209. It is also possible to shorten a purge time by suppressing the retention of the gas on the back side of the cylindrical portion 209. In addition, it is possible to reduce the particles by suppressing the retention of the gas on the back side of the cylindrical portion 209. In addition, it is possible to assist a pressure elevating of the process chamber 201 by supplying the purge gas through the back side of the cylindrical portion 209 during a high pressure process. In the present specification, the nozzle arrangement chamber 222 and the at least one inner wall 248 are collectively referred to as a "gas supply part" (gas supply mechanism). In addition, the gas supply part may further include the nozzles 340a through 340c provided in the nozzle arrangement chamber 222 or the nozzle 340d provided in the gap S. In addition, the gas supply part may further include the flat plate configured to close (or partially close) the upper end of the nozzle arrangement chamber 222.

The first gas exhaust port (first vent) 236 is provided at the cylindrical portion 209 to be opposite to the nozzle arrangement chamber 222. The first gas exhaust port 236 is disposed such that a region where the plurality of the wafers including the wafer 200 of the process chamber 201 is accommodated is interposed between the first gas exhaust port 236 and the nozzle arrangement chamber 222. The first gas exhaust port 236 opens to the region of the process chamber 201 where the plurality of the wafers including the wafer 200 is accommodated from a lower end to an upper end thereof. Hereinafter, the region is also referred to as a "wafer region". The second gas exhaust port (second vent) 237 is provided at the cylindrical portion 209 below the first gas exhaust port 236. The exhaust pipe 231 is open to face the second gas exhaust port 237 at a location in the vicinity of the lower end of the reaction tube 203. As described above, the first gas exhaust port 236 and the second gas exhaust port 237 are provided at the cylindrical portion 209 opposite to the plurality of the gas supply slits 235 when viewed from a center of the cylindrical portion 209. That is, the process chamber 201 and the gap S communicate with each other through the first gas exhaust port 236, and the first gas exhaust port 236 serves as a gas exhaust port configured to exhaust the inner atmosphere of the process chamber 201 to the gap S. The gas exhausted through the first gas exhaust port 236 is exhausted to the outside of the reaction tube 203 through the exhaust port 230 and the exhaust pipe 231 via the gap S provided on the back side of the cylindrical portion 209 (between the cylindrical portion 209 and the reaction tube 203). In addition, an atmosphere (mainly the purge gas) of a lower portion of the process chamber 201 is exhausted to the gap S through the second gas exhaust port 237. According to the configurations described above, the gas having passed through the plurality of the wafers including the wafer 200 is exhausted via the entirety of the back side of the cylindrical portion 209. According to the embodiments, the inner atmosphere of the process chamber 201 is exhausted from the first gas exhaust port 236 to the outlet via an entirety of the gap S excluding the nozzle arrangement chamber 222. As such, a pressure loss between the first gas exhaust port 236 and the outlet is minimized with respect to the reaction tube 203. Therefore, it is possible to minimize a pressure loss by decreasing a difference between a pressure of the exhaust mechanism (outlet) such as the exhaust pipe 231 and a pressure of the wafer region. In addition, by minimizing the pressure loss, it is possible to decrease the pressure of the wafer region and to mitigate the loading effect by increasing the flow velocity of the gas in the wafer region.

Figure 4:
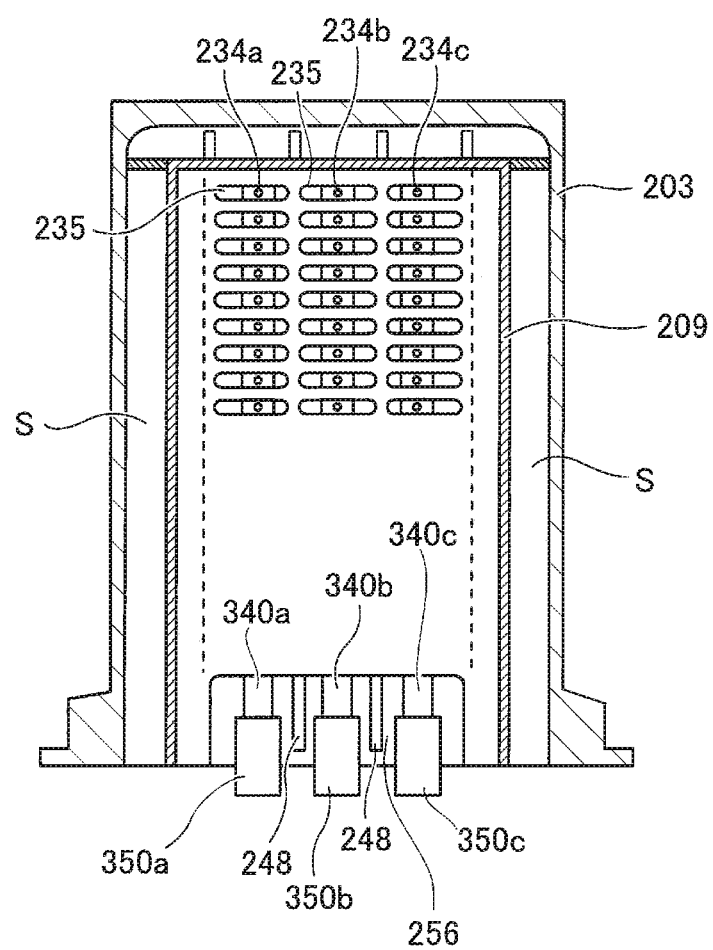
FIG. 4 schematically illustrates a vertical cross-section of the reaction tube of the substrate processing apparatus according to the embodiments.

FIG. 4 schematically illustrates a configuration of the plurality of the gas supply slits 235. In FIG. 4, components such as the boat 217 are omitted for simplification. As shown in FIG. 4, the plurality of the gas supply slits 235 open in a two-dimensional matrix including a plurality of columns and a plurality of rows in the vertical and horizontal directions, respectively. That is, a plurality of horizontally elongated slits facing each of the plurality of the spaces divided (partitioned) by the at least one inner wall 248 in the nozzle arrangement chamber 222 is provided along the vertical direction. The plurality of the horizontally elongated slits serves as the plurality of the gas supply slits 235.

Preferably, it is possible to improve the gas supply efficiency when the lengths (in the circumferential direction of the cylindrical portion 209) of the plurality of the gas supply slits 235 are the same as the lengths (in the circumferential direction) of the plurality of the spaces in the nozzle arrangement chamber 222. Preferably, it is also possible to improve the gas supply efficiency when the plurality of the horizontally elongated slits serving as the plurality of the gas supply slits 235 is arranged in the two-dimensional matrix at locations other than connection portions between the at least one inner wall 248 and the cylindrical portion 209. Preferably, the number of the rows of the plurality of the gas supply slits 235 is the same as the number of the plurality of the spaces partitioned by the at least one inner wall in the nozzle arrangement chamber 222. According to the embodiments, for example, three rows of the plurality of the gas supply slits 235 are provided corresponding to the three spaces partitioned by the at least one inner wall. In other words, the plurality of the gas supply holes 234a, the plurality of the gas supply holes 234b, the plurality of the gas supply holes 234c, the plurality of the gas supply slits 235 (which correspond to the plurality of the gas supply holes 234a, the plurality of the gas supply holes 234b and the plurality of the gas supply holes 234c, respectively) and the first gas exhaust port 236 are on the straight lines, and each of the straight lines substantially pass through a center of the process chamber 201.

Edge portions (such as four corners) of the plurality of the gas supply slits 235 are formed as smooth curves. By curving the edge portions by a process such as a rounding process (R process), it is possible to suppress the stagnation of the gas at the edge portions and to suppress the formation of a film on the edge portions. It is also possible to prevent the film from being peeled off when the film is formed on the edge portions.

An opening portion 256 is provided at the lower end of the cylindrical portion 209 where the nozzle arrangement chamber 222 is provided. The opening portion 256 is used to install the nozzles 340a through 340c in the nozzle arrangement chamber 222. The nozzles 340a through 340c are fixed to the manifold 226 while being attached to the nozzle supports 350a through 350c at the lower ends thereof. Each of the nozzle supports 350a through 350c includes two portions, that is, a portion to which the nozzles 340a through 340c are attached in advance, and a portion to which the manifold 226 is fixed in advance. The nozzles 340a through 340c are installed in the nozzle arrangement chamber 222 in the following manner: (i) the nozzles 340a through 340c are inserted into each of the spaces from the nozzle arrangement chamber 222 to the opening portion 256; (ii) the two portions of the nozzle supports 350a through 350c are fitted; and (iii) the two portions are fixed with components such as bolts. In addition, components (not shown) capable of finely adjusting a position and an angle of the nozzles 340a through 340c may be used suitably for the installation.

The at least one inner wall 248 in the nozzle arrangement chamber 222 is provided from the ceiling of the nozzle arrangement chamber 222 to an upper portion of the lower end of the reaction tube 203. Specifically, a lower end of the at least one inner wall 248 is provided lower than an upper end of the opening 256. In addition, the lower end of the at least one inner wall 248 is provided higher than the lower end of the reaction tube 203 and lower than the upper ends of the nozzle supports 350a through 350c. An upper end of the at least one inner wall 248 is provided higher than the upper end of the ceiling of the cylindrical portion 209.

Figure 5:
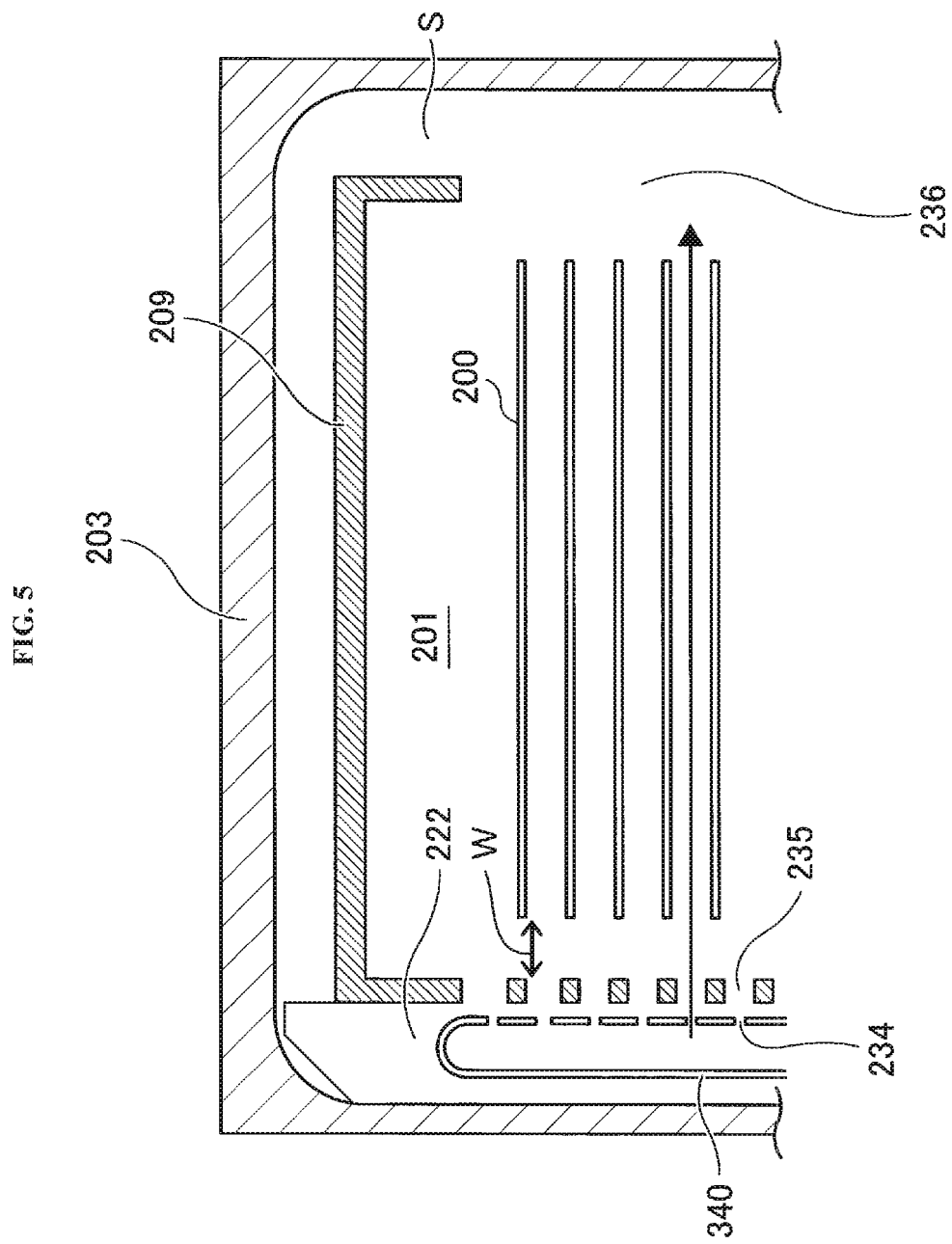
FIG. 5 is an enlarged view schematically illustrating an upper portion of the reaction tube of the substrate processing apparatus according to the embodiments.

As shown in FIG. 5, the plurality of the gas supply slits 235 is arranged in the vertical direction so as to face spaces between adjacent wafers among the plurality of the wafers including the wafer 200 supported in multiple stages by the boat 217 accommodated in the process chamber 201. In FIG. 5, the boat 217 is omitted for simplification. Preferably, the plurality of the gas supply slits 235 is disposed from a location facing a space between a lowermost wafer among the plurality of the wafers and the bottom plate of the boat 217 to a location facing a space between an uppermost wafer among the plurality of the wafers and the top plate of the boat 217 in a manner that the plurality of the gas supply slits 235 faces the space between the lowermost wafer and the bottom plate, the space between the uppermost wafer and the top plate and all the spaces between the adjacent wafers among the plurality of the wafers.

It is preferable that a plurality of gas supply holes 234a, a plurality of gas supply holes 234b and a plurality of gas supply holes 234c of the nozzles 340a through 340c face central portions of the plurality of the gas supply slits 235 with one-to-one correspondence with the plurality of the gas supply slits 235. For example, when the number of the plurality of the gas supply slits 235 is 26, the number of the plurality of the gas supply holes 234a, the number of the plurality of the gas supply holes 234b and the number of the plurality of the gas supply holes 234c are all 26. That is, it is preferable that the number of the plurality of the gas supply slits 235, the number of the plurality of the gas supply holes 234a, the number of the plurality of the gas supply holes 234b and the number of the plurality of the gas supply holes 234c are greater than the number of the plurality of the wafers supported by the boat 217 by one.

The first gas exhaust port 236 is provided at the wafer region of the cylindrical portion 209, and the process chamber 201 and the gap S communicate with each other through the first gas exhaust port 236. The second gas exhaust port 237 extends from a location higher than an upper end of the exhaust port 230 to a location higher than a lower end of the exhaust port 230. With the configurations of the plurality of the gas supply slits 235, the first gas exhaust port 236 and the second gas exhaust port 237 described above, it is possible to form a flow of the process gas on each of the plurality of the wafers including the wafer 200 in a direction parallel to the plurality of the wafers as indicated by an arrow shown in FIG. 5. It is possible to minimize the width W of the gap between the cylindrical portion 209 and the plurality of the wafers within a range in which the boat 217 can be safely inserted and rotated in order to suppress the flow of the process gas bypassing the outsides of the plurality of the wafers.

Figure 6:
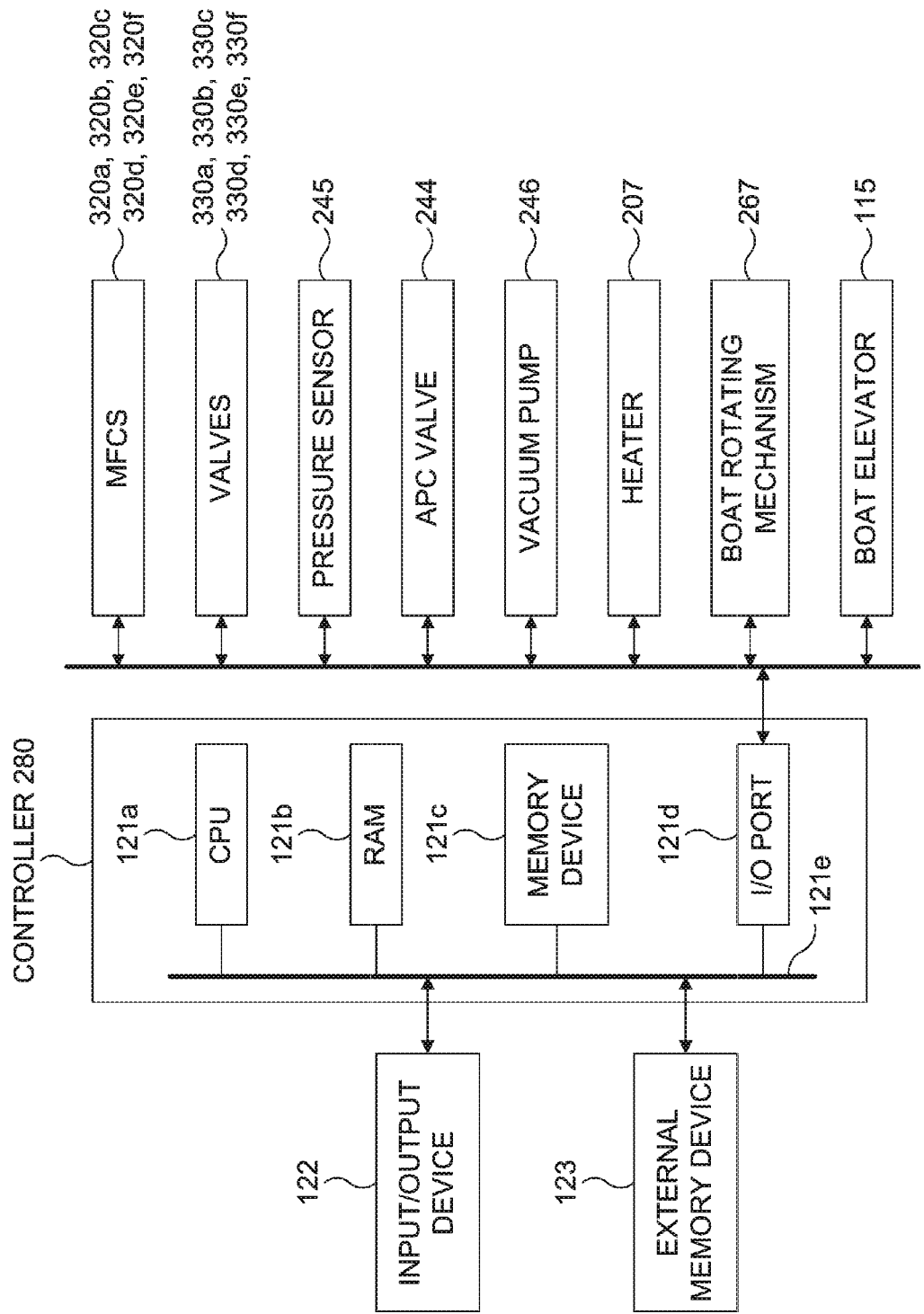
FIG. 6 is a block diagram schematically illustrating a configuration of a controller and related components of the substrate processing apparatus according to the embodiments.

As shown in FIG. 6, a controller 280 serving as a control device (control mechanism) is constituted by a computer including a CPU (Central Processing Unit) 121a, a RAM (Random Access Memory) 121b, a memory device 121c and an I/O port 121d. The RAM 121b, the memory device 121c and the I/O port 121d may exchange data with the CPU 121a through an internal bus 121e. For example, an input/output device 122 such as a touch panel is connected to the controller 280.

For example, the memory device 121c is configured by components such as a flash memory and HDD (Hard Disk Drive). A control program for controlling the operation of the substrate processing apparatus or a process recipe containing information on the sequences and conditions of a substrate processing (also referred to as a "film-forming process") described later is readably stored in the memory device 121c. The process recipe is obtained by combining steps of the substrate processing described later such that the controller 280 can execute the steps to acquire a predetermine result, and functions as a program. Hereinafter, the process recipe and the control program are collectively referred to as a "program". In the present specification, the term "program" may indicate only the process recipe, indicate only the control program, or indicate both of them. The RAM 121b functions as a memory area (work area) where a program or data read by the CPU 121a is temporarily stored.

The I/O port 121d is connected to the above-described components such as the MFCs 320a through 320f, the valves 330a through 330f, the pressure sensor 245, the APC valve 244, the vacuum pump 246, the heater 207, the temperature sensor (not shown), the boat rotating mechanism 267 and the boat elevator 115.

The CPU 121a is configured to read the control program from the memory device 121c and execute the control program. Furthermore, the CPU 121a is configured to read the process recipe from the memory device 121c according to an instruction such as an operation command inputted from the input/output device 122. According to the contents of the process recipe read from the memory device 121c, the CPU 121a may be configured to control various operations such as flow rate adjusting operations for various gases by the MFCs 320a through 320f, opening/closing operations of the valves 330a through 330f, an opening/closing operation of the APC valve 244, a pressure adjusting operation by the APC valve 244 based on the pressure sensor 245, a start and stop of the vacuum pump 246, a temperature adjusting operation of the heater 207 based on the temperature sensor, an operation of adjusting rotation and rotation speed of the boat 217 by the boat rotating mechanism 267 and an elevating and lowering operation of the boat 217 by the boat elevator 115.

While the embodiments will be described by way of an example in which the controller 280 is embodied by a dedicated computer system, the controller 280 is not limited to the dedicated computer system. For example, the controller 280 may be embodied by a general computer system. For example, the controller 280 may be embodied by preparing an external memory device 123 storing the above-described program and installing the program stored in the external memory device 123 into the general computer system. For example, the external memory device 123 may include a magnetic disk such as a hard disk, an optical disk such as a CD, a magneto-optical disk such as an MO and a semiconductor memory such as a USB memory. The means for providing the program to the computer is not limited to the external memory device 123. The program may be supplied to the computer using communication means such as the Internet and a dedicated line without using the external memory device 123. The memory device 121c or the external memory device 123 may be embodied by a non-transitory computer readable recording medium. Hereafter, the memory device 121c and the external memory device 123 are collectively referred to as the recording medium. In the present specification, the term "recording medium" may refer to only the memory device 121c, only the external memory device 123 or both of the memory device 121c and the external memory device 123.

Hereinafter, the operation of the substrate processing apparatus according to the embodiments of the present disclosure will be described. The operations of the components of the substrate processing apparatus are controlled by the controller 280.

The boat 217 with a predetermined number of the plurality of the wafers including the wafer 200 accommodated therein is transferred (loaded) into the reaction tube 203, and the reaction tube 203 is airtightly closed by the seal cap 219. In the reaction tube 203 airtightly closed, by heating the plurality of the wafers and by supplying the process gas into the reaction tube 203, the plurality of the wafers is subject to the substrate processing (heat treatment) such as the heating.

By performing the substrate processing (heat treatment), a silicon nitride film (SiN film) is deposited on the plurality of the wafers including the wafer 200. For example, the SiN film is deposited on the wafer 200 by alternately supplying $NH_3$ gas serving as the first process gas, HCDS gas serving as the second process gas and $N_2$ gas serving as the third process gas. That is, a cycle including a step of supplying the HCDS gas onto the wafer 200, a step of purging by the $N_2$ gas, a step of supplying the $NH_3$ gas onto the wafer 200 and a step of purging by the $N_2$ gas is performed a predetermined number of times to deposit the SiN film on the wafer 200. For example, the processing conditions are as follows:

The temperature of the wafer 200: 400° C. to 650° C.;
The inner pressure of the process chamber 201: 1 Pa to 3,000 Pa;
The flow rate of the HCDS gas: 1 sccm to 2,000 sccm;
The flow rate of the $NH_3$ gas: 100 sccm to 10,000 sccm;
The flow rate of the $N_2$ gas: 10 sccm to 10,000 sccm; and
The thickness of the SiN film: 0.2 nm to 10 nm.

First, the HCDS gas is supplied into the process chamber 201 through the gas supply pipe 310b of the second process gas supply system via the plurality of the gas supply holes 234b of the nozzle 340b and the plurality of the gas supply slits 235. Specifically, the valves 330b and 330f are opened to start the supply of the HCDS gas through the gas supply pipe 310b into the process chamber 201 together with a carrier gas. When the HCDS gas is supplied into the process chamber 201, the opening degree of the APC valve 244 is adjusted to maintain the inner pressure of the process chamber 201 at a predetermined pressure. After a predetermined time has elapsed, the valve 330b is closed to stop the supply of the HCDS gas.

The HCDS gas supplied into the process chamber 201 is supplied to the wafer 200 while being thermally decomposed into a gas phase. The HCDS gas and materials such as reaction products flow in parallel on the wafer 200, then flow through the first gas exhaust port 236 to the gap S from the upper portion to the lower portion of the gap S. Then, the HCDS gas and materials such as the reaction products are exhausted through the exhaust pipe 231 via the second gas exhaust port 237 and the exhaust port 230. A thermal decomposition temperature of the HCDS gas is about 350° C. When the substrate processing is performed in the process chamber 201 at a temperature of about 600° C., the temperature of the process chamber 201 is 200° C. or more higher than the thermal decomposition temperature of the HCDS gas.

When the HCDS gas is supplied into the process chamber 201, the inert gas such as the $N_2$ gas may be supplied by opening the valve 330e of the gas supply pipe 310e connected to the gas supply pipe 310a and by opening the valves 330c and 330d of the gas supply pipes 310c and 310d in order to prevent the HCDS gas from flowing into the gas supply pipes 310a, 310c and 310d.

After the valve 330b is closed to stop the supply of the HCDS gas into the process chamber 201, the inner atmosphere of the process chamber 201 is exhausted to remove the HCDS gas and the materials such as the reaction product remaining in the process chamber 201. When the inner atmosphere of the process chamber 201 is exhausted, the inert gas such as the $N_2$ gas may be supplied through the gas supply pipes 310a, 310b, 310c and 310d into the process chamber 201 and the gap S to purge the process chamber 201 and the gap S. By supplying the inert gas, it is possible to further improve the efficiency of removing the residual gas from the process chamber 201 and the gap S.

Next, the $NH_3$ gas is supplied into the process chamber 201 through the gas supply pipe 310a of the first process gas supply system via the plurality of the gas supply holes 234a of the nozzle 340a and the plurality of the gas supply slits 235. Specifically, the valves 330a and 330e are opened to start the supply of the $NH_3$ gas through the gas supply pipe 310a into the process chamber 201 together with the carrier gas. When the $NH_3$ gas is supplied into the process chamber 201, the opening degree of the APC valve 244 is adjusted to maintain the inner pressure of the process chamber 201 at a predetermined pressure. After a predetermined time has elapsed, the valve 330a is closed to stop the supply of the $NH_3$ gas.

The $NH_3$ gas supplied into the process chamber 201 is supplied to the wafer 200. The $NH_3$ gas flows in parallel on the wafer 200, then flows through the first gas exhaust port 236 to the gap S from the upper portion to the lower portion of the gap S. Then, the $NH_3$ gas is exhausted through the exhaust pipe 231 via the second gas exhaust port 237 and the exhaust port 230.

When the $NH_3$ gas is supplied into the process chamber 201, the inert gas such as the $N_2$ gas may be supplied by opening the valve 330f of the gas supply pipe 310f connected to the gas supply pipe 310b and by opening the valves 330c and 330d of the gas supply pipes 310c and 310d in order to prevent the $NH_3$ gas from flowing into the gas supply pipes 310b, 310c and 310d.

After the valve 330a is closed to stop the supply of the $NH_3$ gas into the process chamber 201, the inner atmosphere of the process chamber 201 is exhausted to remove the $NH_3$ gas and materials such as the reaction product remaining in the process chamber 201. When the inner atmosphere of the process chamber 201 is exhausted, the inert gas such as the $N_2$ gas may be supplied through the gas supply pipes 310a, 310b, 310c and 310d into the process chamber 201 and the gap S to purge the process chamber 201 and the gap S. By supplying the inert gas, it is possible to further improve the efficiency of removing the residual gas from the process chamber 201 and the gap S.

When the substrate processing of the wafer 200 is completed, the boat 217 is transferred (unloaded) out of the reaction tube 203 in the order reverse to that of the loading of the boat 217 described above. The plurality of the wafers including the wafer 200 is transferred from the boat 217 to a pod of a transfer shelf (not shown) by a wafer transfer mechanism (not shown), and the pod is transferred from the transfer shelf to a pod stage (not shown) by a pod transfer mechanism (not shown). Then, the pod is transferred to the outside of a housing of the substrate processing apparatus by an external transfer mechanism (not shown).

While the embodiments of the technique are described by way of an example in which the first process gas and the second process gas are alternately supplied, the technique is not limited thereto. The technique described herein may also be applied when the first process gas and the second process gas are supplied simultaneously.

While the embodiments of the technique are described by way of an example in which the nozzle arrangement chamber 222 is partitioned (divided) into three spaces, the technique is not limited thereto. The technique described herein may also be applied when the nozzle arrangement chamber 222 is partitioned into two spaces or partitioned into four or more spaces. It is possible to change (vary) the number of the spaces partitioned in the nozzle arrangement chamber 222 according to the number of the nozzles required for a desired thermochemical treatment process. In addition, it is possible to arrange a plurality of nozzles in the same space in the nozzle arrangement chamber 222 as long as the gases supplied through the plurality of the nozzles do not react with each other. While the embodiments of the technique are described by way of an example in which one nozzle, that is, the nozzle 340d is disposed in the gap S between the cylindrical portion 209 and the reaction tube 203, the technique is not limited thereto. The technique described herein may also be applied when two or more nozzles are disposed in the gap S.

For example, it is possible to change (vary) the shape of the nozzle. For example, the gas supply hole of the nozzle is not limited to a minute pore provided for each of the plurality of the wafers, but may be a slit extending across the plurality of the wafers in the longitudinal direction of the nozzle. When the plurality of the gas supply holes of the nozzle installed in a central space is opened not to the wafer 200 but to the side wall of the nozzle arrangement chamber 222, the process gas is diffused in the central space. Therefore, it is possible to uniformly supply the process gas through the plurality of the gas supply slits. Furthermore, the nozzle may be a simple pipe with an open front end whose length does not reach the position of a lowermost gas supply slit of the plurality of the gas supply slits.

The nozzle arrangement chamber 222 is not limited to the configuration including a wall shared with the cylindrical portion 209 on the inner circumferential side thereof (that is, an inner circumferential wall of the nozzle arrangement chamber 222 is shared with the cylindrical portion 209). For example, the entirety of the inner circumferential side of the nozzle arrangement chamber 222 may be open to the process chamber 201. Similarly, the nozzle arrangement chamber 222 is not limited to the configuration including a common wall with the reaction tube on the outer circumferential side thereof. For example, the nozzle arrangement chamber 222 may include its own wall instead of the common wall. For example, the nozzle arrangement chamber 222 may be configured by a bulge in which the cylindrical portion is expanded outward.

According to the embodiments described above, it is possible to provide at least one or more of the following effects.

(a) It is possible to minimize a pressure loss at downstream sides of the plurality of the wafers including the wafer 200 and to uniformize the velocity distribution between wafers among the plurality of the wafers. That is, it is possible to minimize the pressure loss by exhausting the gas after passing through the plurality of the wafers through the back side of the cylindrical portion 209. Therefore, it is possible to decrease the pressure in the wafer region. By decreasing the pressure in the wafer region, it is possible to increase the flow velocity of the gas in the wafer region and to mitigate the loading effect.

(b) By providing the nozzle arrangement chamber 222 between the reaction tube 203 and the cylindrical portion 209 and by providing the reaction tube 203 of a perfect circular cylinder, it is possible to reduce the thickness of the reaction tube 203 and the volume of the process chamber 201. In addition, by reducing the locations of the welding, it is possible to manufacture the reaction tube 203 easily. It is also possible to increase the strength of the reaction tube 203 and to shorten the time for elevating the inner temperature of the process chamber 201.

(c) By providing the cylindrical portion 209 in the immediate vicinity of the plurality of the wafers so as to surround the plurality of the wafers, it is possible to increase the ratio of an amount of the gas supplied onto the surfaces of the plurality of the wafers to an amount of the gas supplied through the nozzle arrangement chamber 222. For example, when the cylindrical portion 209 in the present embodiments is not used, the above ratio of the gas supplied onto the surfaces of the plurality of the wafers is about 6%. However, when the cylindrical portion 209 in the present embodiments is used, it is possible to improve the above ratio of the gas supplied onto the surfaces of the plurality of the wafers to about 50%.

(d) By providing the nozzle for purging on the back side of the cylindrical portion 209 and by efficiently purging the back side of the cylindrical portion 209, it is possible to shorten the purge time by suppressing the retention of the gas on the back side of the cylindrical portion 209. In addition, it is possible to reduce the particles by suppressing the retention of the gas on the back side of the cylindrical portion 209.

(e) By providing the nozzle for purging on the back side of the cylindrical portion 209, it is possible to assist the pressure elevating of the process chamber 201 during the high pressure process.

Experimental Results

Figure 7:
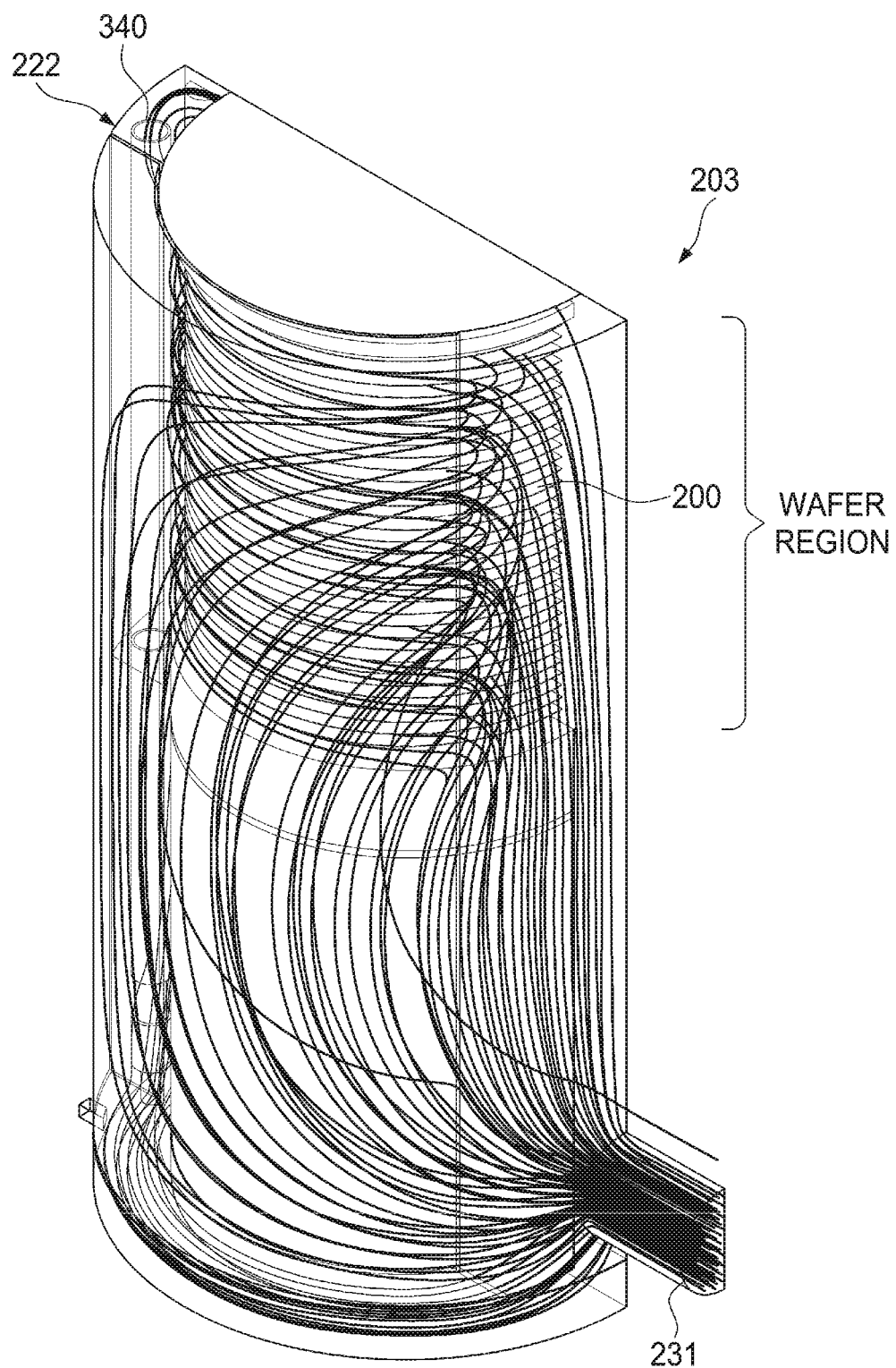
FIG. 7 schematically illustrates a result of analyzing a gas flow in the reaction tube of the substrate processing apparatus according to the embodiments.

FIG. 7 schematically illustrates a result of analyzing a gas flow in the reaction tube 203 of the substrate processing apparatus according to the embodiments. As shown in FIG. 7, the gas supplied through the nozzle 340 (that is, the nozzles 340*a* through 340*c*) passes between the wafers of the plurality of the wafers including the wafer 200 in the process chamber 201, and is exhausted through the exhaust pipe 231 via the first gas exhaust port 236, the back side of the cylindrical portion 209 and the second gas exhaust port 237. That is, by providing the first gas exhaust port 236 at the wafer region where the plurality of the wafers including the wafer 200 is accommodated from the lower end to the upper end thereof, it is possible to reduce the pressure loss since the cross-sectional area of the first gas exhaust port 236 through which the gas passes is increased.

Figure 8B:
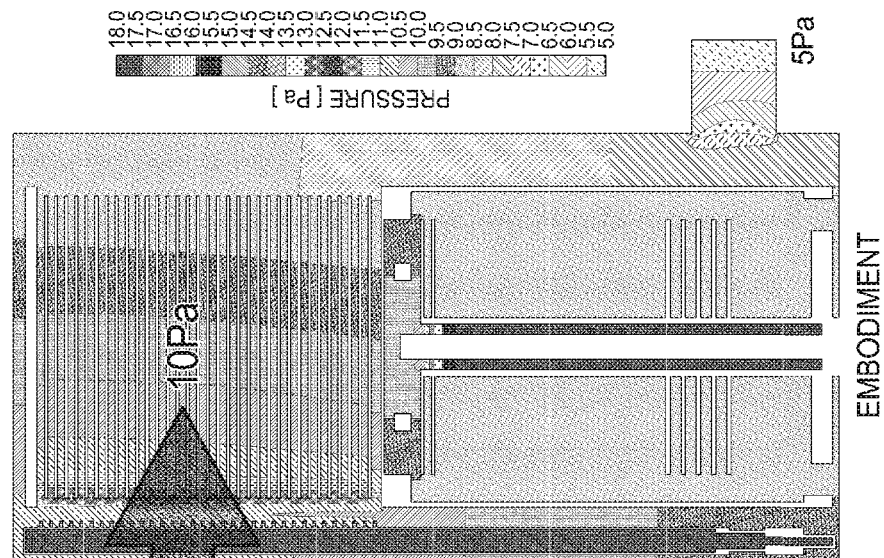
FIG. 8A schematically illustrates a pressure distribution in a reaction tube of a substrate processing apparatus according to a comparative example, and FIG. 8B schematically illustrates a pressure distribution in the reaction tube of the substrate processing apparatus according to the embodiments.
Figure 8A:
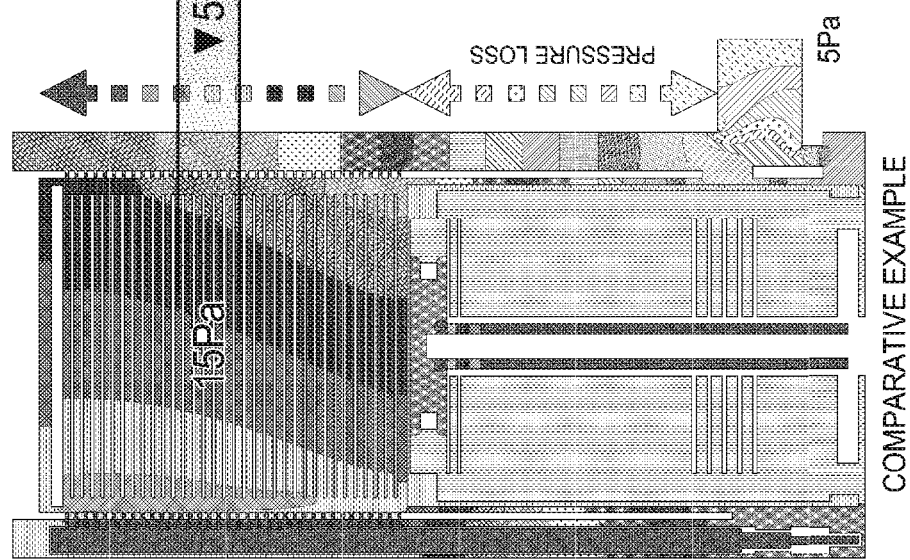

FIG. 8A schematically illustrates a pressure distribution in a reaction tube of a substrate processing apparatus according to a comparative example, and FIG. 8B schematically illustrates a pressure distribution in the reaction tube of the substrate processing apparatus according to the embodiments. The reaction tube according to the comparative example shown in FIG. 8A is different from that of the embodiments in the configuration of the gas exhaust port provided in the reaction tube and the cylindrical portion. According to the reaction tube of the comparative example, a plurality of gas exhaust slits having the same shape as the plurality of the gas supply slits of the embodiments is provided at positions corresponding to the plurality of the gas supply slits.

In the reaction tube of the comparative example, the pressure of the wafer region is 15 Pa due to the pressure loss as shown in FIG. 8A even when the pressure is set to 5 Pa by the exhaust mechanism such as the APC valve 244, the pressure sensor 245 and the vacuum pump 246. However, in the reaction tube according to the present embodiments, the pressure of the wafer region is 10 Pa as shown in FIG. 8B even when the pressure is set to 5 Pa by the exhaust mechanism, and the pressure loss is reduced by 5 Pa compared to that of the comparative example. Since the flow velocity on the wafer 200 is inversely proportional to the pressure on the wafer 200, it is confirmed that the flow velocity on the wafer 200 in the reaction tube according to the present embodiments is 1.5 times the flow velocity on the wafer 200 in the reaction tube according to the comparative example.

Figure 9:
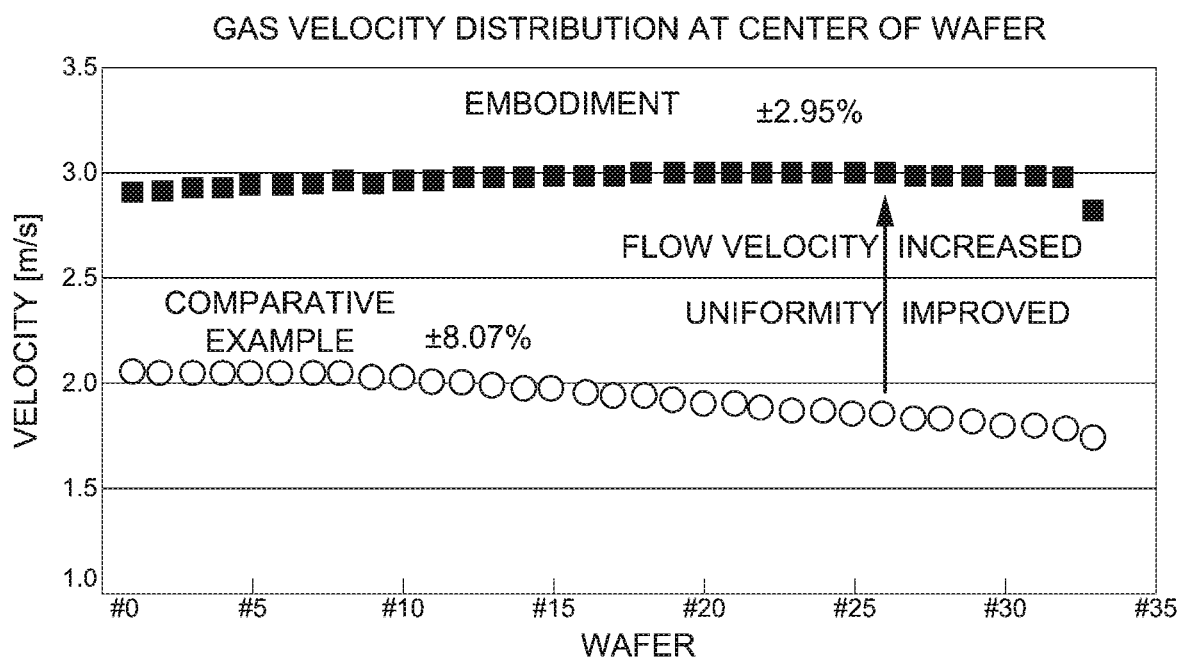
FIG. 9 schematically illustrates a gas velocity distribution at centers of a plurality of wafers in the reaction tube of the substrate processing apparatus according to the embodiments and a gas velocity distribution at the centers of the plurality of the wafers in the reaction tube of the substrate processing apparatus according to the comparative example.
Figure 10:
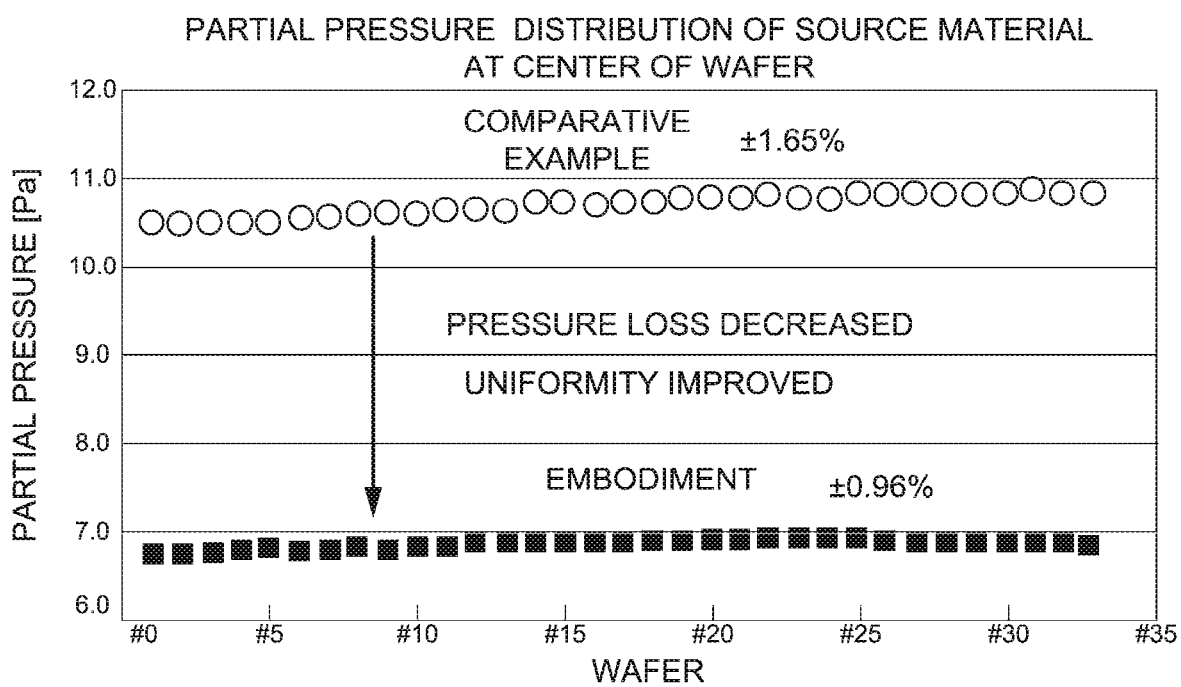
FIG. 10 schematically illustrates a partial pressure distribution of a source material at the centers of the plurality of the wafers in the reaction tube of the substrate processing apparatus according to the embodiments and a partial pressure distribution of the source material at the centers of the plurality of the wafers in the reaction tube of the substrate processing apparatus according to the comparative example.

FIG. 9 schematically illustrates a gas velocity distribution (also referred to as a "flow velocity distribution") at centers of the plurality of the wafers including the wafer 200 in the reaction tube according to the embodiments and a gas velocity distribution (flow velocity distribution) at the centers of the plurality of the wafers in the reaction tube according to the comparative example when the film-forming process is performed using the reaction tube according to the embodiments and the reaction tube according to the comparative example, respectively. FIG. 10 schematically illustrates a partial pressure distribution of a source material at the centers of the plurality of the wafers in the reaction tube according to the embodiments and a partial pressure distribution of the source material at the centers of the plurality of the wafers in the reaction tube according to the comparative example when the film-forming process is performed using the reaction tube according to the embodiments and the reaction tube according to the comparative example, respectively.

When processing a large volume of wafers, it is preferable for the flow velocity of the gas to be increased, because the efficiency of cleaning by-products is increased and the loading effect on the surfaces of the wafers is improved. As shown in FIG. 9, when the reaction tube according to the comparative example is used, the deviation of the gas velocity distribution at the centers of the upper and lower wafers among the plurality of the wafers is ±8.07%. Thereby, the flow velocity distribution is not uniform according to the comparative example. That is, according to the comparative example, the pressure loss occurs and the flow velocity of the lower wafer is higher than that of the upper wafer. In addition, as shown in FIG. 10, the deviation of the partial pressure distribution of the source material at the centers of the upper and lower wafers among the plurality of the wafers is ±1.65%, and a film thickness on the upper wafer is greater than a film thickness on the lower wafer.

However, as shown in FIG. 9, when the reaction tube according to the present embodiments is used, the deviation of the gas velocity distribution at the centers of the upper and lower wafers among the plurality of the wafers is improved to ±2.95%. Even when the experiment is performed under the same conditions as in the comparative example, the flow velocity according to the present embodiments is faster than the flow velocity according to the comparative example. That is, by reducing the pressure loss as compared with the comparative example, the flow velocity is increased and the uniformity of the flow velocity is also improved. In addition, as shown in FIG. 10, the deviation of the partial pressure distribution of the source material at the centers of the upper and lower wafers among the plurality of the wafers is ±0.96%, and the degree of accelerating decomposition of the film forming gas (process gas) is substantially uniform in the upper and lower wafers. Thereby, the uniformity of the film thickness is improved. According to the technique of the present disclosure, the standard indicators of the deviation of the flow velocity and the deviation of the pressure between the wafers among the plurality of the wafers are preferably 5% or less and 1.2% or less, respectively. Both high flow rates and high pressures cause large film thickness. When the deviation of the flow velocity and the deviation of the pressure are correlated with the wafer position with the same sign (that is, both of the correlations are greater than zero or smaller than zero), the preferred deviation of the flow velocity and the preferred deviation of the pressure are, for example, 3% or less and 1% or less, respectively.

The film-forming process performed by the substrate processing apparatus may include, for example, a CVD (Chemical vapor deposition) process, a PVD (Physical vapor deposition) process, an ALD (Atomic layer deposition), an epitaxial growth process, processes for forming an oxide film or a nitride film, and processes for forming a film containing a metal. In addition, the film-forming process may include a process such as an annealing process, an oxidation process, a diffusion process and an etching process.

While the technique is described by way of the above-described embodiments and the experimental results, the above-described technique is not limited thereto. The above-described embodiments may be appropriately combined.

According to some embodiments in the present disclosure, it is possible to uniformize the velocity distribution of the process gas among the plurality of the wafers.

What is claimed is:
1. A substrate processing apparatus comprising:
a reaction tube with a closed upper end, which constitutes a reaction vessel;
a substrate retainer configured to accommodate a plurality of substrates;
a cylindrical portion provided inside the reaction tube in a manner concentric with the reaction tube and comprising a process chamber where the plurality of the substrates is processed, the process chamber being configured to accommodate the substrate retainer;
a gas supply part provided in an annular gap between the reaction tube and the cylindrical portion along an extending direction of the gap, and configured to supply a process gas into the process chamber;
a gas supply port through which the gas supply part communicates with the process chamber;
a first gas exhaust port provided at the cylindrical portion, through which the gap communicates with the process chamber, and configured to exhaust an inner atmosphere of the process chamber to the gap;
an outlet connected to the reaction tube at a location lower than the first gas exhaust port and opposite to the gas supply port when viewed from a center of the cylindrical portion, and configured to exhaust an inner atmosphere of the gap; and
a second gas exhaust port provided at the cylindrical portion at a location lower than the first gas exhaust port and aligned with a same orientation as the outlet with reference to the center of the cylindrical portion, and configured to exhaust an atmosphere of a lower portion of the process chamber.

2. The substrate processing apparatus of claim 1, wherein the gas supply part comprises:
a nozzle arrangement chamber partitioned within the gap between an outer surface of the cylindrical portion and an inner surface of the reaction tube; and
at least one inner wall configured to partition the nozzle arrangement chamber into a plurality of spaces.

3. The substrate processing apparatus of claim 2, wherein an outer circumferential wall of the nozzle arrangement chamber is shared with the reaction tube, an inner circumferential wall of the nozzle arrangement chamber is shared with the cylindrical portion, and the at least one inner wall is configured to divide the plurality of the spaces and to connect the outer surface of the cylindrical portion to the inner surface of the reaction tube.

4. The substrate processing apparatus of claim 2, wherein an upper end of the cylindrical portion is closed, and the gas supply part further comprises a plate provided at a same height as an upper end of a ceiling of the cylindrical portion to close a part of the upper end of the ceiling of the cylindrical portion.

5. The substrate processing apparatus of claim 4, wherein an upper end of the at least one inner wall extends higher than the upper end of the ceiling of the cylindrical portion.

6. The substrate processing apparatus of claim 5, wherein the inner atmosphere of the process chamber is exhausted from the first gas exhaust port to the outlet using an entirety of the gap excluding the nozzle arrangement chamber such that a pressure loss between the first gas exhaust port and the outlet is minimized with respect to the reaction tube of a predetermined diameter.

7. The substrate processing apparatus of claim 5, wherein the gas supply part further comprises a gas nozzle provided in the gap and configured to supply an inert gas to the gap.

8. The substrate processing apparatus of claim 2, wherein the first gas exhaust port, the second gas exhaust port and the outlet are provided opposite to the gas supply port when viewed from the center of the cylindrical portion.

9. The substrate processing apparatus of claim 2, wherein the gas supply part further comprises a gas nozzle provided in the nozzle arrangement chamber and configured to supply a decomposable process gas into the process chamber.

10. The substrate processing apparatus of claim 9, wherein the gas supply port comprises a plurality of horizontally elongated slits facing the first gas exhaust port, and the plurality of the horizontally elongated slits is vertically arranged from a location facing a space between a lowermost wafer among the plurality of the substrates and a bottom plate of the substrate retainer to a location facing a space between an uppermost wafer among the plurality of the substrates and a top plate of the substrate retainer in a manner that the plurality of the horizontally elongated slits faces the space between the lowermost wafer and the bottom plate, the space between the uppermost wafer and the top plate and all spaces between adjacent substrates among the plurality of the substrates, respectively.

11. The substrate processing apparatus of claim 1, wherein the first gas exhaust port extends from a lower end of a region where the plurality of the substrates is accommodated to an upper end of the region, the process gas exhausted through the first gas exhaust port is exhausted to an outside of the reaction tube through the gap and the outlet, and a width of the gap is greater than twice a distance between the cylindrical portion and the plurality of the substrates.

12. The substrate processing apparatus of claim 11, wherein an upper end of the cylindrical portion is closed, and the gas supply part further comprises a plate provided at a same height as an upper end of a ceiling of the cylindrical portion to close a part of the upper end of the ceiling of the cylindrical portion.

13. The substrate processing apparatus of claim 12, wherein an upper end of the at least one inner wall extends higher than the upper end of the ceiling of the cylindrical portion.

14. The substrate processing apparatus of claim 13, wherein the inner atmosphere of the process chamber is exhausted from the first gas exhaust port to the outlet using an entirety of the gap excluding the nozzle arrangement chamber such that a pressure loss between the first gas exhaust port and the outlet is minimized with respect to the reaction tube of a predetermined diameter.

15. The substrate processing apparatus of claim 13, wherein the gas supply part further comprises a gas nozzle provided in the gap and configured to supply an inert gas to the gap.

16. The substrate processing apparatus of claim 11, wherein the first gas exhaust port, the second gas exhaust port and the outlet are provided opposite to the gas supply port when viewed from the center of the cylindrical portion.

17. The substrate processing apparatus of claim 11, wherein the gas supply part further comprises a gas nozzle provided in a nozzle arrangement chamber and configured to supply a decomposable process gas into the process chamber.

18. The substrate processing apparatus of claim 17, wherein the gas supply port comprises a plurality of horizontally elongated slits facing the first gas exhaust port, and the plurality of the horizontally elongated slits is vertically arranged from a location facing a space between a lowermost wafer among the plurality of the substrates and a bottom plate of the substrate retainer to a location facing a space between an uppermost wafer among the plurality of the substrates and a top plate of the substrate retainer in a manner that the plurality of the horizontally elongated slits faces the space between the lowermost wafer and the bottom plate, the space between the uppermost wafer and the top plate and all spaces between adjacent substrates among the plurality of the substrates, respectively.

19. A method of manufacturing a semiconductor device comprising:
  providing the substrate processing apparatus of claim 1; and
  processing a plurality of substrates by performing:
  (a) transferring a substrate retainer configured to accommodate the plurality of the substrates in a process chamber in a cylindrical portion provided inside a reaction tube in a manner concentric with the reaction tube;
  (b) supplying a process gas into the process chamber through a gas nozzle and a gas supply port, wherein the gas nozzle is provided in a nozzle arrangement chamber partitioned within an annular gap between the reaction tube and the cylindrical portion, and the gas supply port is provided at the cylindrical portion so as to allow the nozzle arrangement chamber to communicate with the process chamber; and
  (c) exhausting an inner atmosphere of the process chamber to the gap through a first gas exhaust port provided at the cylindrical portion so as to allow the gap to communicate with the process chamber, exhausting an atmosphere of a lower portion of the process chamber to the gap through a second gas exhaust port provided at the cylindrical portion at a location lower than the first gas exhaust port wherein the second gas exhaust port is aligned with a same orientation as an outlet with reference to a center of the cylindrical portion, and exhausting an atmosphere having exhausted to the gap to an outside of the reaction tube through the outlet connected to the reaction tube at a location lower than the first gas exhaust port and opposite to the gas supply port when viewed from the center of the cylindrical portion.

20. A reaction tube used in a substrate processing apparatus, comprising:
  a cylindrical portion provided inside the reaction tube constituting a reaction vessel in a manner concentric with the reaction tube, wherein the cylindrical portion comprises a process chamber where a plurality of substrates is processed and configured to accommodate a substrate retainer configured to accommodate the plurality of the substrates;
  a nozzle arrangement chamber partitioned within an annular gap between the reaction tube and the cylindrical portion and accommodating therein a gas nozzle configured to supply a process gas into the process chamber;
  a gas supply port provided at the cylindrical portion, through which the nozzle arrangement chamber communicates with the process chamber;
  a first gas exhaust port provided at the cylindrical portion, through which the gap communicates with the process chamber, and configured to exhaust an inner atmosphere of the process chamber to the gap;
  an outlet provided at the reaction tube at a location lower than the first gas exhaust port and opposite to the gas supply port when viewed from a center of the cylindrical portion and configured to exhaust an inner atmosphere of the gap; and
  a second gas exhaust port provided at the cylindrical portion at a location lower than the first gas exhaust port and aligned with a same orientation as the outlet with reference to the center of the cylindrical portion and configured to exhaust an atmosphere of a lower portion of the process chamber.

* * * * *